United States Patent [19]

Pliskin et al.

[11] Patent Number: 4,506,435

[45] Date of Patent: Mar. 26, 1985

[54] METHOD FOR FORMING RECESSED ISOLATED REGIONS

[75] Inventors: William A. Pliskin; Jacob Riseman, both of Poughkeepsie; Joseph F. Shepard, Hopewell Junction, all of N.Y.

[73] Assignee: International Business Machines Corporation, Armonk, N.Y.

[21] Appl. No.: 287,468

[22] Filed: Jul. 27, 1981

[51] Int. Cl.³ .................. H01L 21/76; H01L 21/95
[52] U.S. Cl. ................................ 29/576 W; 29/571; 29/578; 148/1.5; 148/175; 148/187; 357/34; 357/41; 357/49; 357/50; 427/90; 427/93
[58] Field of Search ............... 29/571, 578, 576 W, 29/580; 148/1.5, 175, 187; 427/90, 93; 357/73, 34, 41, 47, 49, 50

[56] References Cited

U.S. PATENT DOCUMENTS

| | | | |
|---|---|---|---|
| 3,534,234 | 10/1970 | Clevenger | 357/50 X |
| 3,648,125 | 3/1972 | Peltzer | 357/50 |
| 3,900,350 | 8/1975 | Appels et al. | 148/175 |
| 3,925,572 | 12/1975 | Naber | 427/90 X |
| 3,958,040 | 5/1976 | Webb | 427/94 |
| 3,961,999 | 6/1976 | Antipov | 148/175 |
| 3,966,514 | 6/1976 | Feng et al. | 148/187 |
| 3,966,577 | 6/1976 | Hochberg | 204/192 |
| 3,970,486 | 7/1976 | Kooi | 148/187 |
| 3,997,378 | 12/1976 | Kaji et al. | 148/174 |
| 4,002,511 | 1/1977 | Magdo et al. | 148/187 |
| 4,046,605 | 9/1977 | Nelson et al. | 148/175 |
| 4,104,086 | 8/1978 | Bondur et al. | 148/1.5 |
| 4,140,558 | 2/1979 | Murphy et al. | 29/580 X |
| 4,159,915 | 7/1979 | Anantha et al. | 29/576 W X |
| 4,170,492 | 10/1979 | Bartlett et al. | 148/1.5 |
| 4,202,916 | 5/1980 | Chadda | 427/93 X |
| 4,222,792 | 9/1980 | Lever et al. | 427/93 X |
| 4,301,324 | 11/1981 | Kumar et al. | 174/68.5 |
| 4,404,735 | 9/1983 | Sakurai | 29/580 X |

OTHER PUBLICATIONS

IBM Technical Disclosure Bulletin, vol. 20, No. 1, Jun. 1977, pp. 144–145, S. A. Abbas, "Recessed Oxide Isolation Process".

*Primary Examiner*—Brian E. Hearn
*Assistant Examiner*—David A. Hey
*Attorney, Agent, or Firm*—George O. Saile

[57] ABSTRACT

A method is described for forming the recessed dielectric isolation in a silicon substrate involves first forming trenches which may be less than about 1 micron in depth in areas of one principal surface of the silicon substrate where isolation is desired. Where, for example, an NPN bipolar transistor structure is planned to be formed it is usually necessary to have a P+ region underneath the recessed dielectric isolation to allow full isolation between the various bipolar transistor devices. A PNP transistor uses an N+ region underneath the isolation. Where a field effect transistor is planned a channel stop can be substituted for the P+ region. Under the circumstance of bipolar devices, the P+ region is formed in the substrate prior to the deposition of an epitaxial layer thereover. The trench formation is caused to be formed through the epitaxial layer and into the P+ regions therein. The surface of the trenches are then oxidized in an oxidizing ambient to form a silicon dioxide layer thereon. A glass is deposited over this principal surface. The glass used has a thermal coefficient of expansion that approximates that of silicon and has a softening temperature of less than about 1200° C. The structure is then heated to a temperature that allows the flow of the deposited glass on the surface so as to fill the trenches. The glass on the principal surface above the trench can be removed by a reactive ion etching method. Alternatively and preferably, the glass is removed from areas other than the immediate area of the trench by lithography and etching techniques followed by a second heating of the structure to cause the glass flow to result in surface planarization.

28 Claims, 9 Drawing Figures

METHOD FOR FORMING RECESSED ISOLATED REGIONS

TECHNICAL FIELD

The invention relates to methods for dielectrically isolating regions of monocrystalline silicon from other regions of monocrystalline silicon and more particularly to techniques which completely overcome the "bird's beak" problem while reducing stresses in the semiconductor structure.

CROSS-REFERENCE TO RELATED PATENT APPLICATIONS (1) U.S. patent application Ser. No. 287,466 filed like date entitled "Deep Dielectric Isolation by Fused Glass", by W. K. Chu, W. A. Pliskin and J. Riseman (FI 9-80-065).

(2) U.S. patent application Ser. No. 287,467 filed like date entitled "Planarization of Integrated Circuits", by W. A. Pliskin and J. Riseman (FI 9-81-045).

DESCRIPTION OF THE PRIOR ART

In the monolithic integrated circuit technology, it is usually necessary to isolate various active and passive elements from one another in the integrated circuit structure. These devices have been isolated by backbiasing PN junctions, partial dielectric isolation and complete dielectric isolation. The dielectric material used have been silicon dioxide and the like. The preferred isolation for these active devices and circuits is some form of dielectric isolation. The dielectric isolation has the substantial advantage over the PN junction isolation because it allows the abutting of the circuit elements against the isolation and thereby result in greater density of packing of the active and passive devices on the integrated circuit chip.

One form of dielectric isolation involves the formation of grooves or depressions in silicon where the isolation regions are to be formed. During the groove formation, the remainder of the silicon surface is protected by a protective film which is substantially unaffected by the silicon etch used to form the grooves. The usual protective layer is a silicon nitride, silicon dioxide sandwich layer. Following the formation of the grooves by conventional chemical etching, the silicon body is subjected to a conventional oxidation step whereby the silicon in the groove area is oxidized and the silicon dioxide fills up the groove as well as oxidizing further into the silicon to form the isolation region. One of the major problems with this process is what is known as "bird's beak".

The "bird's beak" is a non-planar silicon dioxide formation at the top periphery of the groove and is caused by the lateral oxidation underneath the silicon dioxide layer. Since the oxidation of a specific thickness of silicon requires an almost equivalent amount of free space to expand into, and since the $SiO_2/Si_3N_4$ limits the unrestricted expansion, the result is an up-pushing of the silicon dioxide/silicon nitride at the edge of the groove. The final consequence of this is a general stress in the perimeter region of the groove as well as difficulties in subsequently achieving good abutted diffusions against the vertical portion of the silicon dioxide. This nonabutting capability defeats a major benefit of the original purpose of the silicon dioxide region. This process is described more fully by E. Kooi U.S. Pat. No. 3,970,486, Clevenger U.S. Pat. No. 3,534,234, Peltzer U.S. Pat. No. 3,648,125 and I. Magdo et al., patent application Ser. No. 150,609, filed June 7, 1971. Efforts to minimize this "bird's beak" problem have been extensive and include J. A. Appels et. al. U.S. Pat. No. 3,900,350; P. W. D. Webb U.S. Pat. No. 3,958,040; I. Antipov U.S. Pat. No. 3,961,999; B-C. Feng et. al. U.S. Pat. No. 3,966,514; I. Magdo et. al. U.S. Pat. No. 4,002,511; and K. G. Bartlett et. al. U.S. Pat. No. 4,170,492.

An alternate to recessed oxide isolation is deep dielectric isolation which involves the formation of rectangular grooves made in the Hochberg U.S. Pat. No. 3,966,577, T. Kaji et. al. U.S. Pat. No. 3,997,378, J. A. Bondur et. al. U.S. Pat. No. 4,104,086 and S. A. Abbas, IBM TDB Vol. 20, No. 1, p. 144, June 1977 entitled "Recessed Oxide Isolation Process", by reactive ion etching techniques and filling the grooves to form the isolation for the silicon regions. The groove filling techniques all involve either thermal oxidation and/or chemical vapor deposition techniques and extensively use silicon dioxide as the dielectric isolation.

All of these prior recessed isolation methods have the disadvantage of having the isolation comprising either silicon dioxide or combinations of silicon dioxide and silicon nitride or the like. There is a mismatch between the coefficient of thermal expansion of silicon dioxide, which is $5.5 \times 10^{-7}$ per degree centigrade, and that of silicon, which is about $35 \times 10^{-7}$ per degree centigrade. Multiple heat cycling steps, required in the usual manufacture of integrated circuit steps after the formation of the recessed isolation cause stresses to build in the silicon substrate due to this diversity between coefficients of thermal expansion. These stresses can ultimately cause defects in the integrated circuits and result in yield loses.

SUMMARY OF THE PRESENT INVENTION

The shallow recessed dielectric type of isolation is of the order of 1 micrometers in depth or less as compared to what is termed deep recessed dielectric isolation which extends into the silicon substrate 3 to 5 micrometers or more. The method for forming the recessed dielectric isolation in a silicon substrate involves first forming trenches which may be less than about 1 micron in depth in areas of one principal surface of the silicon substrate where isolation is desired for field effect transistor devices. Where a bipolar transistor structure is planned to be formed it is usually necessary to have P+ region underneath the recessed dielectric isolation to allow full isolation between the various NPN bipolar transistor devices. To make a PNP transistor it is necessary to use a N+ region underneath the isolation. Under the circumstance the P+ region is formed in the substrate prior to the deposition of an epitaxial layer thereover. The trench formation is caused to be formed through the epitaxial layer and into the P+ regions therein. The surface of the trenches are then oxidized in an oxidizing ambient to form a silicon dioxide layer thereon. A glass is deposited over this principal surface. The glass used has a thermal coefficient of expansion that approximates that of silicon and has a softening temperature of less than about 1200° C. The structure is then heated to a temperature that allows the flow of the deposited glass on the surface so as to fill the trenches. The glass on the principal surface above the trench can be removed by a reactive ion etching method. Alternatively and preferably the glass is removed from areas other than the immediate area of the trench by lithography and etching techniques followed by a second heating of the structure to cause the glass flow to result in surface planarization.

DESCRIPTION OF THE PREFERRED EMBODIMENTS

Figure 1:
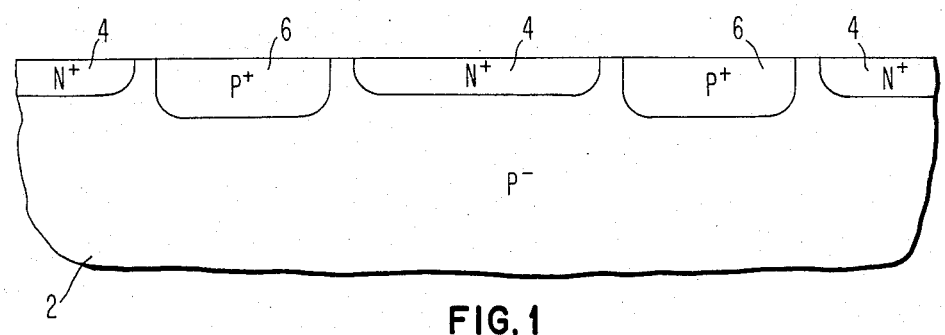
FIGS. 1 through 6 illustrate a first method embodiment of forming the recessed dielectric isolation intended for bipolar transistor purposes.

Referring now to more particularly FIG. 1, there is shown a semiconductor body 2 of a P− conductivity type. The semiconductor body is typically <100> crystallographically oriented silicon and of a resistivity in the order of 1 to 20 ohm-cm. Conventional lithography and etching techniques are utilized to form the mask for the subcollector diffusion step. N type impurities are then diffused by conventional techniques to form a region having a surface concentration level of typically $5 \times 10^{20}$ atoms/cc. The N type impurity may be, for example, arsenic or antimony.

The structure is now subjected to a thermal oxidation to form silicon dioxide thereover. Simultaneously with the growth of the silicon dioxide, the N type impurity is driven further into the semiconductor body. The silicon dioxide layer is now formed into a diffusion mask using conventional lithography and etching techniques. The body is now subjected to a diffusion of P type impurity, such as boron, preferably of a high concentration level, such as $3 \times 10^{20}$ atoms/cc at the surface of the exposed silicon regions to form P+ regions 6 which will ultimately form part of the recessed dielectric isolation and junction isolation regions between devices of the semiconductor bipolar structure.

Figure 2:
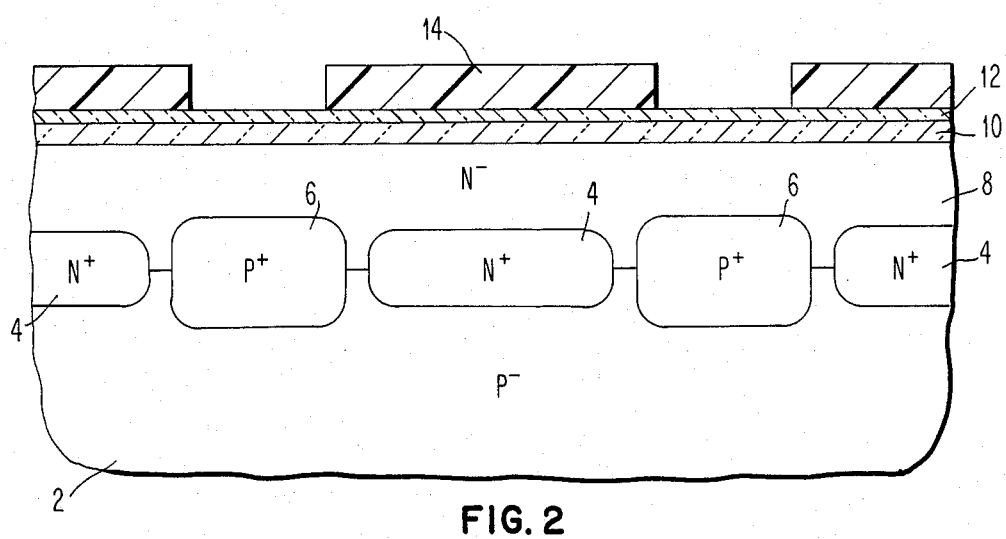

The silicon dioxide layer on the surface of the silicon body is removed by use of conventional etching techniques. The silicon body is then placed in an epitaxial growth chamber and a monocrystalline silicon layer 8 is grown upon the principal surface of the silicon body having the diffusions 4 and 6 therein. This growth is done by conventional techniques such as the use of SiCl$_4$/H$_2$ or SiH$_4$/H$_2$ mixtures at growth temperatures of about 1000° C. to 1200° C. The thickness of the epitaxial layer is typically 2 micrometers but may be in the range of 0.5 to 10 micrometers. During the epitaxial growth the epitaxial layer is doped with an N type impurity of a low concentration level which is typically $2 \times 10^{16}$ atoms/cc. During the epitaxial growth, the N+ region 4 and the P+ diffused region 6 move into the epitaxial layer to fully form the final N+ region 4 and P+ region 6 as illustrated in FIG. 2.

Silicon dioxide layer 10 is formed by conventional techniques of either thermal growth at a temperature of about 970° C. in wet or dry oxygen ambient or by chemical vapor deposition. The silicon nitride layer 12 is formed thereover typically by a chemical vapor deposition. A resist layer 14 is deposited over layer 12. This layer is then formed into a mask using conventional lithography techniques so that openings are provided directly above the P+ buried regions 6 as shown in FIG. 2. The layers 10 and 12 are etched using conventional chemical, reactive ion etching or plasma etching techniques at the openings of resist layer 14 down to the monocrystalline silicon substrate.

The structure is now ready to utilize the layers 10, 12 as the mask for the trench 16 formation following the removal of the resist layer 14 from the surface of layer 12. This process may be accomplished using chemical etching but this type of etching causes the walls of the trenches 16 to become more inclined than in the case of use of reactive ion etching. The trenches 16 are preferably formed by reactive ion etching (RIE) which produces substantially vertical sidewalls for the trenches. One suitable example of forming the trenches 16 by RIE is the use of carbontetrafluoride (CF$_4$) gas. Other suitable examples of gases include CCl$_4$—Ar and Cl$_2$—Ar. Details of the RIE are described in the copending patent application of J. M. Harvilchuck et. al. Ser. No. 960,322, filed Nov. 13, 1978, which is a continuation of patent application Ser. No. 822,775, filed Aug. 8, 1975, now abandoned and assigned to the same assignee as the assignee of this invention.

A layer 18 of silicon dioxide is preferably formed by thermal oxidation in steam at a temperature of about 970° C. on the surface of the trenches. The layer 18 of silicon dioxide may alternatively be formed by chemical vapor deposition but this would necessitate the removal of the deposited silicon dioxide from the layer 12 surface. The preferred thickness of the layer 18 of the silicon dioxide is preferably in the range of 1000 to 5000 angstroms. It may also be desirable to form a silicon nitride layer (not shown) on the surface of this silicon dioxide layer 18 to prevent the movement of any unwanted impurities, such as sodium ions, from the glass recessed dielectric isolation through the silicon dioxide into the silicon body. This silicon nitride layer can be deposited by conventional chemical vapor deposition techniques. The result of the process is shown in FIG. 3.

Figure 3:
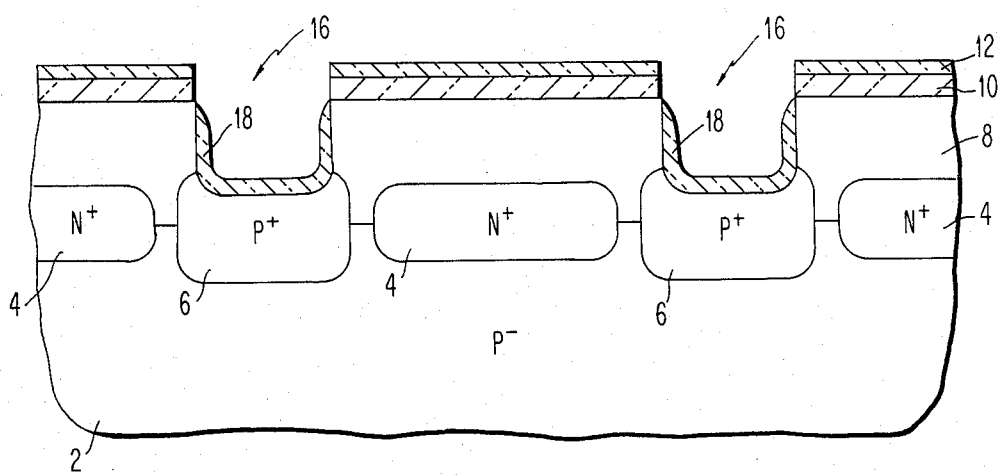

The FIG. 3 structure is now ready to be filled with a dielectric glass material having a thermal coefficient of expansion that approximates that of silicon. The preferred range of the coefficient is between about 20 to $50 \times 10^{-7}$ per degree centigrade. The other important criterion for this glass material is its softening temperature and its ability to flow upon heating to that softening temperature or above. Examples of glasses which will act according to these criterion are given in Tables I, II and III. The listed glasses merely are illustrative of glasses which can be used in this invention. The Table I gives examples of borosilicate, lead borosilicate and calcium alumino borosilicate glasses. The Table II lists glass-ceramics of the β-spodumene type. The Table III lists glass-ceramics of the cordierite type. The Tables II and III were taken from the A. H. Kumar et. al. U.S. Pat. No. 4,301,324 and assigned to the same assignee as the present invention.

For glasses containing impurities which could cause device problems, the silicon dioxide layer 18 in FIG. 3 can be capped by depositing a thin silicon nitride layer of the order of 500 to 1500 Å by chemical vapor deposition techniques. This silicon nitride layer will serve as barrier to the diffusion of impurities into the SiO$_2$ layer from the glass.

TABLE I

| Glass or Material | Softening Point (°C.) | Coef. of Thermal Expansion (0–300° C.) per °C. | Weight % Compositions | | | | | | | |
|---|---|---|---|---|---|---|---|---|---|---|
| | | | $SiO_2$ | $B_2O_3$ | PbO | $Al_2O_3$ | CaO | $Na_2O$ | $K_2O$ | Other |
| LEAD BOROSILICATES: | | | | | | | | | | |
| Corning 7723 (X760LZ) | 770 | $35 \times 10^{-7}$ | 51.6 | 12.0 | 29.2 | 6.8 | — | <0.05 | — | 0.4 $As_2O_3$ |
| Corning 7720 | 755 | $36 \times 10^{-7}$ | 73 | 14 | 5.7 | 1.7 | — | 4.4 | — | — |
| BOROSILICATES: | | | | | | | | | | |
| Schott 8329 | 922 | $27.5 \times 10^{-7}$ | 83.2 | 10.9 | — | 2.5 | — | 2.2 | — | |
| Corning 7740 (Pyrex) | 820 | $33 \times 10^{-7}$ | 80.5 | 12.9 | — | 2.2 | — | 3.8 | 0.4 | |
| Corning 7760 | 780 | $34 \times 10^{-7}$ | 79 | 15 | — | 2 | — | 2 | 2 | |
| Corning 7050 | 705 | $46 \times 10^{-7}$ | 67 | 24 | — | 2 | — | 7 | — | |
| Corning 7052 | 710 | $46 \times 10^{-7}$ | 65 | 18 | — | 7 | — | 2 | 3 | 1 $Li_2O$ |
| Corning 7070 | 710 | $32 \times 10^{-7}$ | 71 | 26 | — | 1 | — | 0.5 | 1 | 0.5 $Li_2O$ |
| Corning 9741 | 705 | $39 \times 10^{-7}$ | 66 | 24 | — | 6 | — | 2 | — | 1 $Li_2O$ |
| Corning 3320 (Uranium Glass) | 780 | $40 \times 10^{-7}$ | 75 | 12.7 | 3.4 | 2.4 | — | 4.6 | — | 1.8 $U_3O_8$ |
| CALCIUM ALUMINO-BOROSILICATES: | | | | | | | | | | |
| Corning 1715 | 1060 | $35 \times 10^{-7}$ | 67 | — | — | 22 | 11 | — | — | |
| Corning 191CP | 1125 | $27 \times 10^{-7}$ | 77 | — | — | 16 | 7 | — | — | |
| Silicon | 1450 | $35 \times 10^{-7}$ | — | — | — | — | — | — | — | |
| Fused Silica ($SiO_2$) | 1600 | $5.5 \times 10^{-7}$ | 100 | — | — | — | — | — | — | |

TABLE II
COMPOSITIONS OF β-SPODUMENE GLASS-CERAMICS

| Glass No. | Weight % Compositions | | | |
|---|---|---|---|---|
| | 1 | 2 | 3 | 4 |
| $SiO_2$ | 71.5 | 71.5 | 71.5 | 67.8 |
| $Al_2O_3$ | 15.0 | 13.0 | 13.0 | 16.0 |
| MgO | — | — | — | 1.5 |
| CaO | — | — | — | 4.5 |
| BaO | — | — | — | — |
| ZnO | — | 2.0 | 2.0 | — |
| $Li_2O$ | 10.0 | 10.0 | 8.0 | 4.2 |
| $Na_2O$ | — | — | — | 0.9 |
| $K_2O$ | 2.0 | 2.0 | 2.0 | — |
| $B_2O_3$ | — | — | 2.0 | 1.8 |
| $P_2O_5$ | 1.5 | 1.5 | 1.5 | — |
| $TiO_2$ | — | — | — | 2.5 |
| F | — | — | — | 0.8 |
| Softening Point (°C.) | 925 | 900 | 855 | 910 |
| Thermal Exp. Coef. (°C.$^1$ × $10^7$) | 32 | 43 | 29 | 20 |

TABLE III
CORDIERITE GLASS-CERAMICS (Weight % Compositions)

| Glass No. | 5 | 6 | 7 | 8 | 9 | 10 | 11 | 12 | 13 | 14 |
|---|---|---|---|---|---|---|---|---|---|---|
| MgO | 24 | 24.2 | 21.5 | 22 | 23 | 22 | 23.5 | 23.5 | 24.0 | 24.0 |
| $Al_2O_3$ | 21 | 21.2 | 21 | 22 | 22 | 22 | 21 | 21 | 21.0 | 21.84 |
| $SiO_2$ | 53 | 50.6 | 52.5 | 52.5 | 52 | 52 | 52.5 | 52.5 | 52.5 | 52.5 |
| $P_2O_5$ | 2 | 2.0 | 2 | 1.5 | 2 | 2 | — | — | 1.0 | 1.16 |
| $Li_2O$ | — | — | — | — | — | — | — | — | — | — |
| $B_2O_3$ | — | 2.0 | 1 | 0.5 | 1 | 1 | 1 | 1 | 0.5 | 0.5 |
| $ZrO_2$ | — | — | 2 | 1.5 | — | — | — | — | — | — |
| ZnO | — | — | — | — | — | 1 | — | — | — | — |
| $TiO_2$ | — | — | — | — | — | — | 2 | — | — | — |
| $SnO_2$ | — | — | — | — | — | — | — | 2 | — | — |
| Softening* Point (°C.) | 1050 | 925 | 925 | 950 | 967 | 967 | 967 | 970 | 970 | 972 |
| Thermal Exp. Coef. (°C.$^1$ × $10^7$) | 37 | 30 | 33 | 24 | 23 | 24 | 30 | 33 | 33 | 34 |

Figure 4:
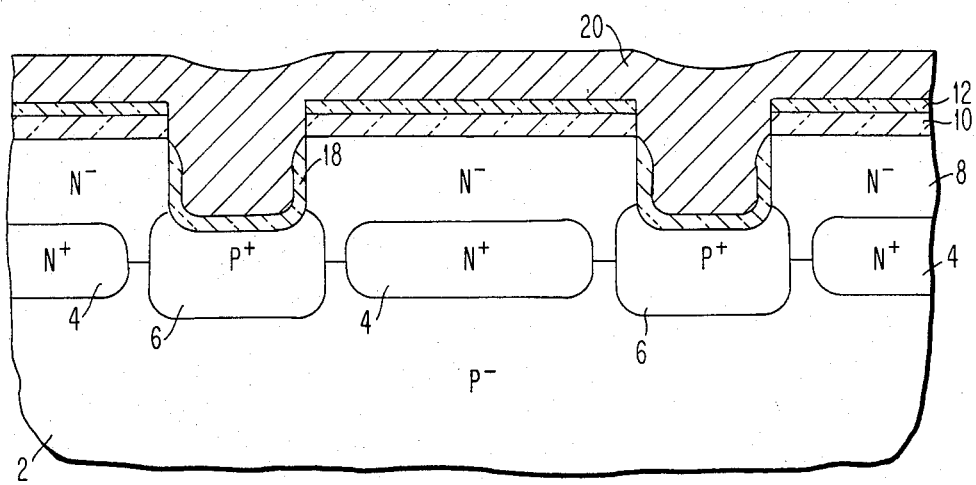

Referring now to FIG. 4 there is shown the result of the deposition and first heating step of a glass layer 20 which fills the trenches 16 and covers the surface of the semiconductor integrated circuit. There are several ways to deposit the glass layer 20. One technique utilizes the sedimentation, centrifugation or spin-on of colloidal glass particles. Other methods would include the sputtering or evaporation of the glass onto a semiconductor silicon surface.

Sedimentation techniques by centrifugation are supplied generally in U.S. Pat. Nos. 3,212,921 and 3,212,929. Glass sedimentation is described in Pliskin and Conrad "Techniques for Obtaining Uniform Thin Glass Film on Substrates," Electrochemical Technology, Vol. 2, No. 7-8, pages 196-200 (1964). Spin-on techniques are described in J. A. Amick et al., J. Vac. Soc. Tech. 14, No. 5, page 1053 (1977). In accordance with this known technology, a finally ground glass powder having properties providing a better match to silicon is employed as illustrated in the Table I. The glass power is ultrasonically mixed with a reasonably high dielectric medium. Typically, such a liquid is isopropyl alcohol. Then a lower dielectric constant fluid, such as ethyl acetate is added and is ultrasonically mixed with the other materials. By centrifugation techniques, coarse particles are then separated from this suspension. Centrifuging for several minutes at a medium rotate speed, for example at 500 G (gravitation) is utilized and the decanted liquid suspension obtained has fine particles of glass desirable for the glass deposition process. These steps may be repeated to obtain better separation and finer particles in the suspension which hereinafter will be referred to as the "concentrate". The glass suspension concentrate will then be coated onto the substrate in accordance with any of the above referenced techniques. The structure is then fired for a few minutes at a temperature above the softening point of the glass to form a clear glass film.

Sputtering methods would be used for depositing the glass by forming a target of the glass material and subsequently applying R.F. The sputtering process for insulators such as the glasses of the present invention is described in detail in the Handbook of Thin Film Technology, by L. I. Maissel et. al., published by McGraw Hill Book Co., New York, NY, 1970, pages 4-31 through 4-44.

The evaporation method for deposition of these glasses use the E-beam evaporation technique. The films so formed would contour to the topography to a greater extent than by the previously mentioned methods. Fusing the glass film will correspondingly flow the glass. The methods for E-beam evaporation of these materials can be better understood with reference to pages 1-65 through 1-73 of the above-cited Handbook of Thin Film Technology and the W. Fedrowitz et. al. paper entitled "The Evaporation Capability of Various Glasses", published in Thin Solid Films, 72 (1980) pages 485 through 486.

The chemical vapor deposited (CVD) method would not use the explicit compositions of Tables I, II and III but essentially deposits the major constituents, for example $SiO_2$, $B_2O_3$, $Al_2O_3$ to form the desired glass with the needed thermal coefficient of expansion and softening point. This would be accomplished, for example, by the conventional use of $SiH_4$, $B_2H_6$, $Al(OC_3H_7)_3$ and $N_2O$ with the concentrations of the B and Al in the approximate ranges shown in the Tables. The method for CVD of glass of the present type can be more fully understood with reference to "Materials, Properties and Preparation", Vol. 3, by S. P. Keller published by North-Holland Pub. Co., Amsterdam, New York, Oxford, 1980, pages 651 through 653 and Amick et. al. J. Vac. Sci. Technol. 14(1977) page 1053.

Figure 5:
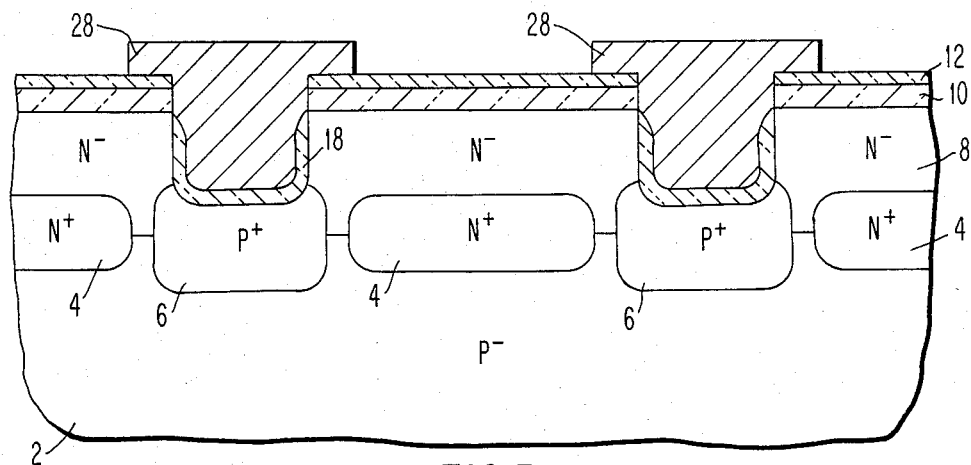
Figure 6:
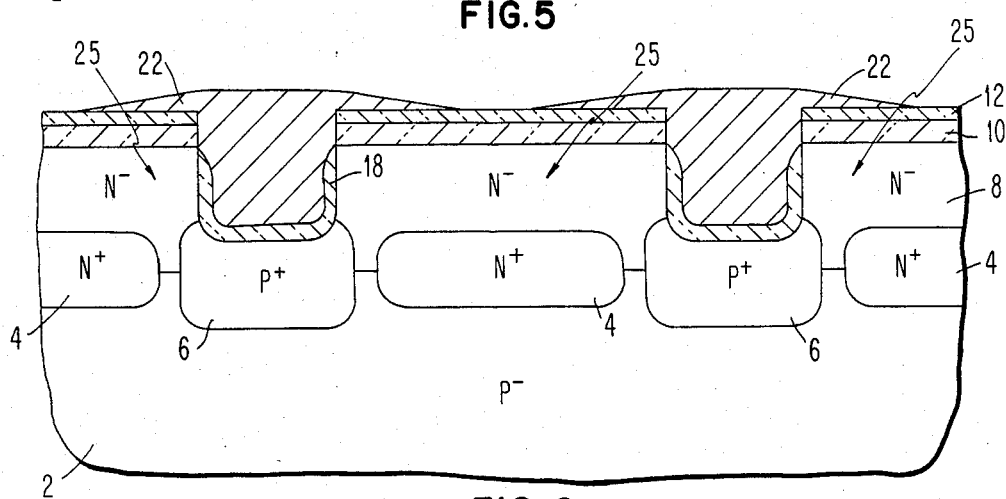

The structure is planarized by heating the structure above the softening point of the glass layer 20. At this temperature the softened glass will flow to approach planarity as shown in FIG. 4. The next step is the method for making the glass filled trench substantially planar with the surface of the masking layer 10, 12. It is preferred to do this by first reducing the glass layer thickness by any of the usual etching methods, that is chemical, plasma or reactive ion etching down to thickness 28 and then by removing the glass from the surface by etching in areas other than in the immediate areas of the trenches as shown in FIG. 5. The structure is now subjected again to heating to a temperature above the softening point of the glass. The result of this heating is the formation of a substantially planar surface of glass layer 22 over the masking layers 10, 12 as shown in FIG. 6.

Alternatively, the glass layer can be removed using any of the usual etching methods including chemical, plasma or reactive ion etching down to the silicon nitride layer 12 which acts as an etch stop. Still another alternative is to etch by any one or a combination of techniques through the glass layer 22, silicon nitride layer 12 and silicon dioxide layer 10 down to the silicon surface plane. Typical plasma and reactive ion etching systems that can be used for this process could include any one of the following gases:

| Gas System | Etch Ratio | |
|---|---|---|
| | PLASMA | |
| $C_2F_6$ + $CHF_3$ | PSG:Si ($SiO_2$):Si | 12:1 |
| $CF_4$ | BSG:$SiO_2$ | 1.8:1 to 6:1 |
| | RIE | |
| $CHF_3$ | $SiO_2$:Si | 10:1 to 15:1 |
| | $SiO_2$:$Si_3N_4$ | 2:1 |
| $CF_4$ + $H_2$ | $SiO_2$:Si | 15:1 to 40:1 |
| $C_2F_6$ + $H_2$ | $SiO_2$:$Si_3N_4$ | 2:1 |
| | $SiO_2$:Si | 20:1 |
| $C_2F_6$ | $SiO_2$:Si | 10:1 |

Bipolar transistors and the like can now be formed in the dielectrically isolated regions 25 wherein the N+ region 4 is the buried subcollector for such devices. Prior to such formation the layers 22, 12 and 10 have to be removed by conventional etching techniques as described above. Isolation of the emitter-base region from the collector reach-through region can alternatively be made by extending the buried subcollector region 4 under a dielectrically isolated region that does not have a P+ junction isolation thereunder in the NPN transistor alternative, for example. The emitter-base region will then be surface isolated from the collector reach-through contact but the base-collector connection is effected through the subcollector region under the recessed dielectric isolation.

Figure 7:
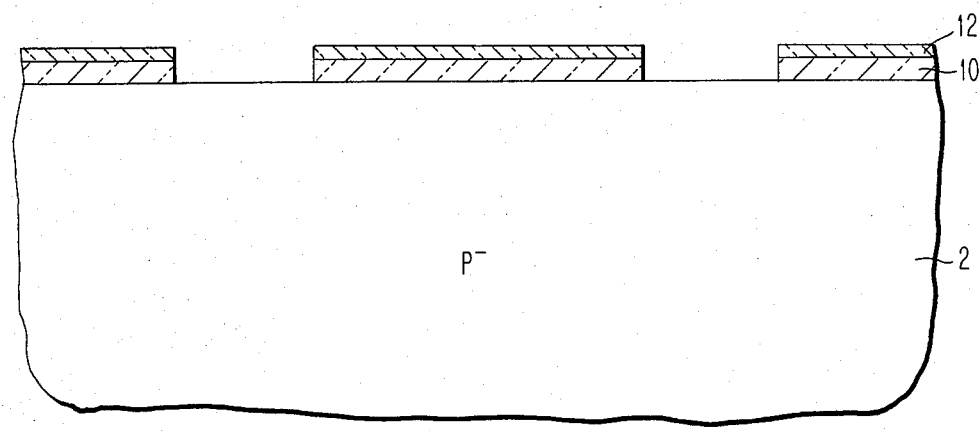
FIGS. 7 through 9 show a second embodiment of the formation of recessed dielectric isolation of the present invention particularly useful for use with field effect transistor devices.
Figure 8:
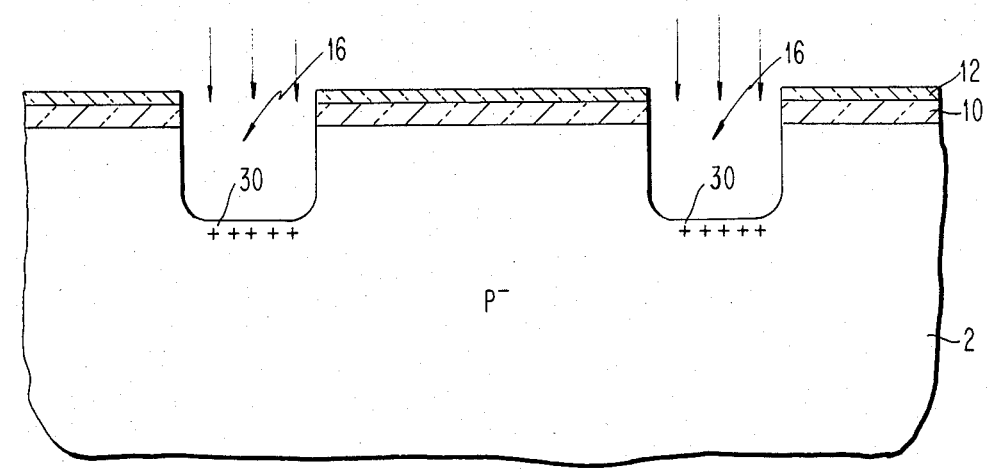
Figure 9:
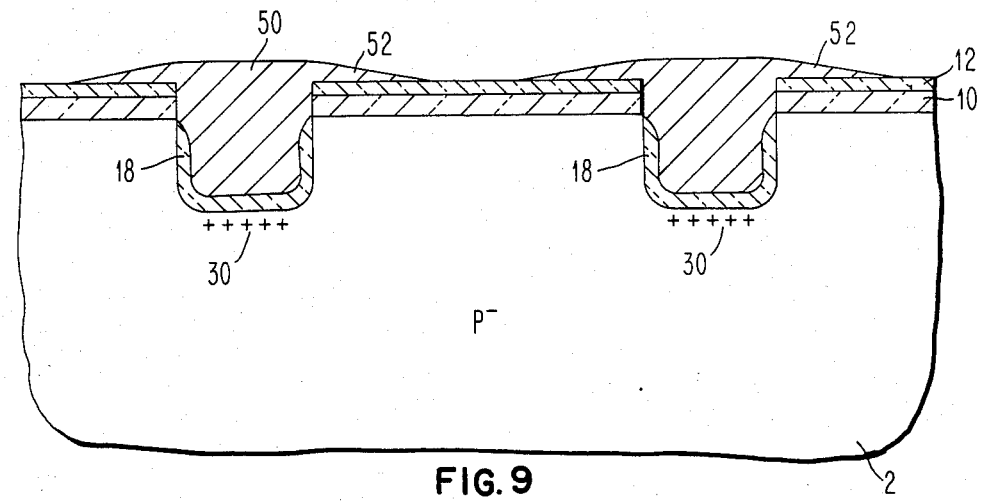

Referring now to FIGS. 7 through 9 there is shown a method for forming recessed dielectric isolation which is useful for field effect transistor devices. The silicon substrate utilized for this type of technology is typically a P— doped substrate having a resistivity of about 1 to 20 ohm-centimeters. Silicon dioxide layers 10 and silicon nitride layer 12 are deposited as described with reference to the example of FIGS. 1 through 6. Lithography techniques are utilized to form the layers 10, 12 into a mask having openings located where recessed dielectric isolation is desired as shown in FIG. 7. The mask is then utilized as described in the first embodiment to form a trench in the silion by either chemical or reactive ion etching techniques as described in that embodiment. After the trenches 16 have been formed, a channel stop 30 is formed beneath the bottom wall of each of the trenches 16. The channel stop 30 is preferably formed by implantation of boron ions having a dose or concentration of about $1 \times 10^{19}$ atoms/cc. This provides each of the channel stops 30 as a P+ area in the P— substrate 2. This channel stop structure avoids any possibility of short circuiting between the various semiconductor isolated regions.

The glass deposition of glass material 50 is made according to the same procedures as described in regard to the first embodiment. The heating and planarizing steps result in the final isolated structure as shown in FIG. 9. The glass layer 52 and the silicon nitride layer 12 is now removed from the surface as described above when describing the first embodiment. The structure is now ready to receive the process for forming the desired field effect transistor devices.

While the invention has been particularly shown and described with reference to the preferred embodiments thereof, it will be understood by those skilled in the art that various changes in form and details may be made without departing from the spirit and scope of the invention, for example other devices than field effect and bipolar transistors can be formed in the monocyrstalline silicon regions within the dielectric isolation regions.

What is claimed is:

1. A method for forming recessed dielectric isolation in a silicon substrate comprising:
   forming by reactive ion etching a pattern of trenches in the order of microns in depth and with substantially vertical walls in the areas of one surface of said substrate wherein said isolation is desired;
   oxidizing the surfaces of said trenches to form a silicon dioxide layer thereon;
   depositing a glass having a thermal coefficient of expansion that approximates that of silicon and is between about 20 to $50 \times 10^{-7}$ per degree centigrade and has a softening temperature of less than about 1200° C. onto the said surface of said substrate; and
   thermally heating the structure to cause the flow of said glass on said surface and filling of said trenches.

2. The method of claim 1 wherein a layer of silicon nitride is formed over said silicon dioxide layer in said trenches.

3. The method of claim 1 wherein said glass is formed by a sedimentation process.

4. The method of claim 3 wherein said sedimentation process involves spray coating of glass particles upon said surfaces of said substrate.

5. The method of claim 3 wherein said sedimentation process involves centrifuging a coating of glass particles upon said surfaces of said substrate.

6. The method of claim 3 wherein said sedimentation process involves a spin-on of a coating of glass particles upon said surfaces of said substrate.

7. The method of claim 1 wherein said glass is formed by a sputtering process.

8. The method of claim 1 wherein said glass is formed by an evaporation process.

9. The method of claim 1 wherein the said heating step raises the temperature of said structure to less than about 1000° C. to cause said flow.

10. The method of claim 1 wherein said glass is a lead borosilicate glass.

11. The method of claim 1 wherein said glass is a calcium alumino borosilicate glass.

12. The method of claim 1 wherein said glass is a β-spodumene glass-ceramic.

13. The method of claim 1 wherein said glass is a cordierite glass-ceramic.

14. The method of claim 2 wherein there is a significant sodium content in said glass.

15. The method of claim 1 wherein the said glass is substantially sodium free.

16. The method of claim 12 and further comprising removing glass from said surface by etching in areas other than the immediate areas of said trenches and heating the structure to cause glass flow and surface planarization.

17. The method of claim 16 wherein each of said heating is at temperatures of less than about 1000° C.

18. The method of claim 1 wherein bipolar transistor devices are formed in said silicon substrate within said recessed dielectric isolation.

19. The method of claim 1 wherein field effect transistor devices are formed in said silicon substrate within said recessed dielectric isolation.

20. The method for forming a bipolar integrated circuit having recessed dielectric isolation in a silicon body comprising:
   providing a monocrystalline silicon substrate;
   forming doped regions of a first conductivity in said substrate in areas designated to be part of subcollector region;
   forming doped regions of a second conductivity in areas designated to form part of a junction isolation which cooperates with said recessed dielectric isolation to isolate regions of said silicon body;
   growing an epitaxial layer upon said substrate wherein during the growth said doped regions of a first conductivity outdiffuse into said epitaxial layer to fully form the said subcollector regions and, said doped regions of a second conductivity outdiffuse into said epitaxial layer to fully form the said junction isolation regions;
   forming by reactive ion etching a pattern of trenches in the order of microns in depth into the areas of said epitaxial layer wherein said isolation is desired and deep enough to penetrate said junction isolation regions thereunder;
   oxidizing the surfaces on said trenches to form a silicon dioxide layer thereon;
   depositing a glass having a thermal coefficient of expansion between about 20 to $50 \times 10^{-7}$ per degree Centigrade and has a softening temperature of less than about 1200° C. onto the said surface of said epitaxial layer;
   thermally heating the structure at a temperature of less than about 1200° C. to cause the flow of said glass on said surface and filling of said trenches; and
   forming said bipolar transistor devices within the silicon body isolated by said recessed dielectric isolation.

21. The method of claim 20 wherein the etching of said trenches produces substantially vertical sidewalls.

22. The method of claim 20 and further comprising removing said glass from said epitaxial layer by etching in areas other than the immediate areas of the trenches and heating the structure to cause glass flow and surface planarization.

23. The method of claim 20 wherein a silicon nitride layer formed over said silicon dioxide layer on said surfaces of the trenches and said glass has a significant sodium content.

24. The method of claim 20 wherein said first conductivity is N type and said second conductivity is P type.

25. A method for forming field effect transistor devices having recessed dielectric isolation in a silicon body comprising:
   forming by reactive ion etching a pattern of trenches in the order of microns in depth in the areas of one surface of said body wherein said isolation is desired;
   forming a channel stop at the bottom of said trenches by ion implantation;
   oxidizing the surfaces of said trenches to form a silicon dioxide layer thereon;
   depositing a glass having a thermal coefficient of expansion between about 20 to $50 \times 10^{-7}$ per degree Centigrade and has a softening temperature of less than about 1200° C. onto the said surface of said substrate;

thermally heating the structure at a temperature less than about 1200° C. to cause the flow of said glass on said surface and filling of said trenches; and forming said field effect transistor devices within and upon said silicon body.

26. The method of claim 25 and further comprising removing said glass from said surface by etching in areas other than the immediate areas of the trenches and heating the structure to cause glass flow and surface planarization.

27. The method of claim 25 wherein a silicon nitride layer formed over said silicon dioxide layer on said surfaces of the trenches and said glass has a significant sodium content.

28. The method of claim 25 wherein said channel stop is P type and said field effect transistors are N type.

* * * * *